United States Patent
Boyd et al.

(10) Patent No.: US 6,993,834 B2
(45) Date of Patent: Feb. 7, 2006

(54) APPARATUS FOR ASSEMBLING CARD EDGE SLOTS INTO A SUBSTRATE

(75) Inventors: Patrick D. Boyd, Aloha, OR (US); Al LaValle, Beaverton, OR (US); Jarett Rinaldi, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 564 days.

(21) Appl. No.: 09/960,291

(22) Filed: Sep. 24, 2001

(65) Prior Publication Data
US 2003/0056979 A1 Mar. 27, 2003

(51) Int. Cl.
*H01R 43/00* (2006.01)

(52) U.S. Cl. ............... 29/764; 29/758; 29/747
(58) Field of Classification Search .......... 29/764, 29/762, 758, 747, 267, 268, 278, 840, 832–834; 294/15; 439/60, 637; 228/180.1

See application file for complete search history.

(56) References Cited

U.S. PATENT DOCUMENTS

| | | | | |
|---|---|---|---|---|
| 4,223,934 A | * | 9/1980 | Cauceglia et al. | 294/15 |
| 4,377,907 A | * | 3/1983 | Bertellotti et al. | 29/747 |
| 4,858,309 A | * | 8/1989 | Korsunsky et al. | 29/764 |
| 5,443,394 A | * | 8/1995 | Billman et al. | 439/157 |
| 5,709,568 A | * | 1/1998 | Pan et al. | 439/541.5 |
| 6,007,357 A | * | 12/1999 | Perino et al. | 439/327 |
| 6,123,558 A | * | 9/2000 | Shibata | 439/157 |
| 6,619,973 B2 | * | 9/2003 | Perino et al. | 439/327 |
| 6,681,480 B1 | * | 1/2004 | Kinsman et al. | 29/759 |

* cited by examiner

*Primary Examiner*—Minh Trinh
(74) *Attorney, Agent, or Firm*—Schwegman, Lundberg, Woessner & Kluth, P.A.

(57) ABSTRACT

A device and method including a slot insertion member is to hold a number of card edge slots having a plurality of pins extending from them in alignment for insertion of the plurality of pins into a plurality of holes of a printed circuit board. At least one grip attachment member is connected to the plurality of slot insertion members to hold the plurality of slot insertion members in a fixed position. At least one grip member is connected to at least one grip attachment member to enable the holding and positioning of the slot holder.

14 Claims, 10 Drawing Sheets

APPARATUS FOR ASSEMBLING CARD EDGE SLOTS INTO A SUBSTRATE

FIELD

The embodiment disclosed herein relates to a device and method for assembling card edge slots into a substrate. More particularly, it enables the simultaneous placement of multiple card edge slots into a printed circuit board (PCB) while reducing the possibility of tilting or movement of the card edge slots during the manufacturing process.

BACKGROUND

Figure 1:
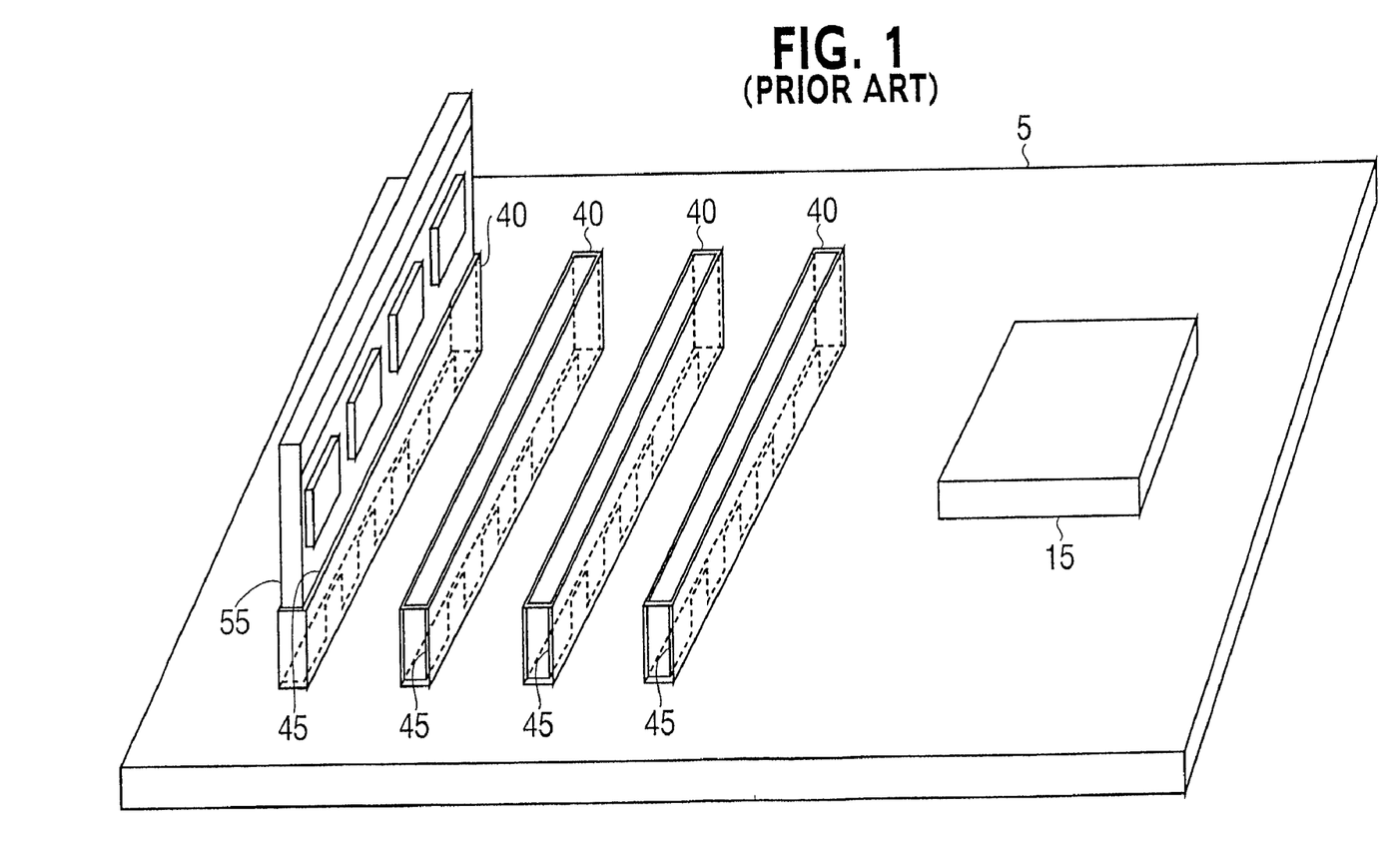
FIG. 1 is a diagram of a printed circuit board having slots and a microprocessor connected thereto.

With the increased competitive environment amongst the providers of personal computers (PCs) and their suppliers, an increased need for improved productivity at lower cost and higher quality has existed as never before. One of the key components in a PC is the baseboard 5, sometimes referred to as a motherboard, in which many components of a computer system are attached. As illustrated in FIG. 1, a baseboard 5 may comprise a printed circuit board of multiple layer design in which holes are drilled therein to accept card-edge slots (slots) 40 and, directly or indirectly, a processor 15. It should be noted that FIG. 1 is provided as an example of a simplified baseboard 5. As would be appreciated by one of ordinary skill in the art, numerous other components, not shown, would be connected to the baseboard 5.

Figure 2A:
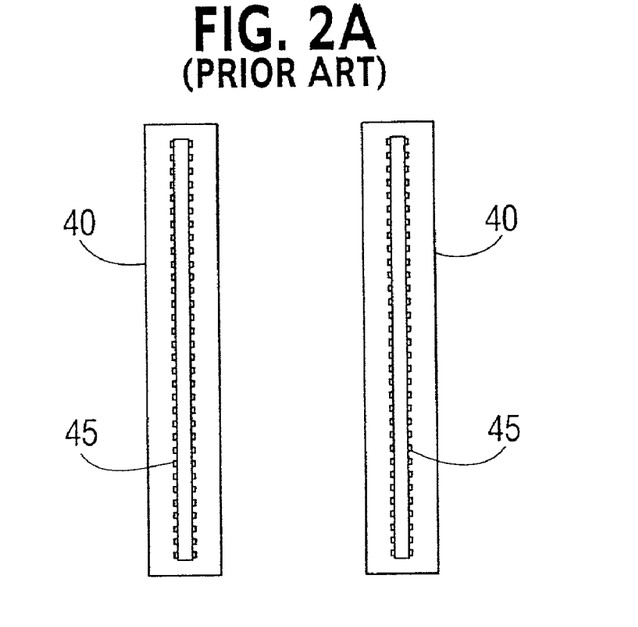
FIG. 2A is a top view of a card edge body (slot)
Figure 2B:
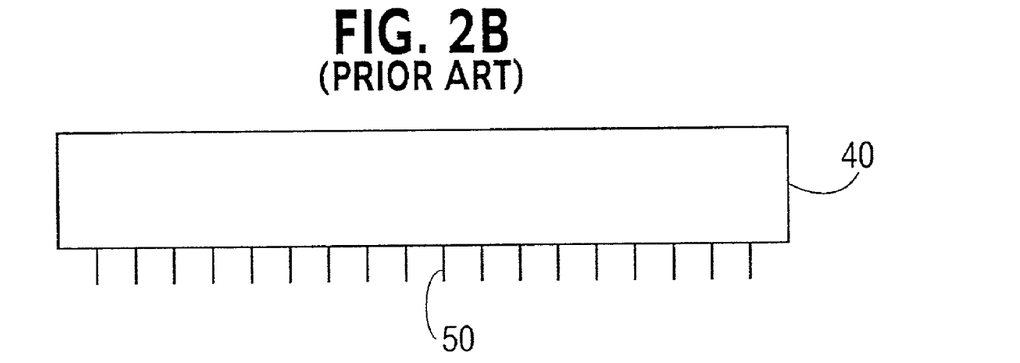
FIG. 2B is a side view of a card edge body (slot)

Once the baseboard 5 or printed circuit board is assembled with holes drilled into the appropriate locations, slots 40, with pins 50 extending from the underside of the slot 40, as shown in FIG. 2B, are manually inserted into the appropriate holes drilled into the printed circuit board or baseboard 5. This insertion of the pins 50 into the holes requires care so that the pins 50 are not bent and the slot 40 does not tilt to one side or another. This process is repeated for each and every slot 40 that needs to be inserted in the particular printed circuit board. Once all slots 40 are inserted through the holes in the printed circuit board, the pins 50 extend beneath the printed circuit board. Thereafter, the printed circuit board is passed over a wave solder machine that solders the pins 50 into position on the printed circuit board. Finally, a card 55 is inserted into electrical contact card slot 45 (card slot 45), as shown in FIGS. 1 and 2A, within slot 40 so that card 55 makes electrical contact with the based board 5. This card 55 may be, but not limited to, a memory board, a sound board, or other peripheral device controller board.

FIG. 2A is a top view of the slot 40, shown in FIG. 1, while FIG. 2B is a side view of the slot 40. Further, FIG. 2A shows further detail of the card slot 45 with the electrical contact points for the card 55 to establish electrical contact therewith. Also, FIG. 2B shows the pins 50 extending through the bottom of the slot 40 and it is these pins 50 which are inserted into baseboard 5 or other printed circuit board.

In addition to improper placement of the slot 40 in the printed circuit board by the installer, during the wave soldering process it is possible for the pins 50 of the slots to be pushed up through the holes in the PC board and possibly have the slots 40 tilted at an angle. Once the slots are tilted at an angle it may become difficult to properly position a board 55, such as, but not limited to a memory board, sound board, or other peripheral board, into the slot 40 so as to make proper electrical contact more difficult or for one board 55 to come into contact with another board 55 in another slot 40. During production inspection phase a board 5 with a tilted slot 45 would be rejected and either reworked to correct the problem requiring additional time, labor, and materials, and increasing the possibility for added handling related damage or entirely scrapped. Thus, it is unlikely that the board 5 would be shipped to the customer.

Thus, the present method for placement of slots into printed circuit boards is time-consuming since each slot is inserted individually and may cause tilting problems to occur due to human error or the action of the wave solder machine.

Therefore, a device and method is needed that will simplify and make more efficient the process of installing slots into printed circuit boards. Further, this device and method should further reduce the possibility of tilting occurring for a given slot either due to manual displacement or the action of a wave disorder machine.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Before beginning a detailed description of embodiments of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGS. for simplicity of illustration and discussion, and so as not to obscure the disclosure of the embodiments.

Figure 3A:
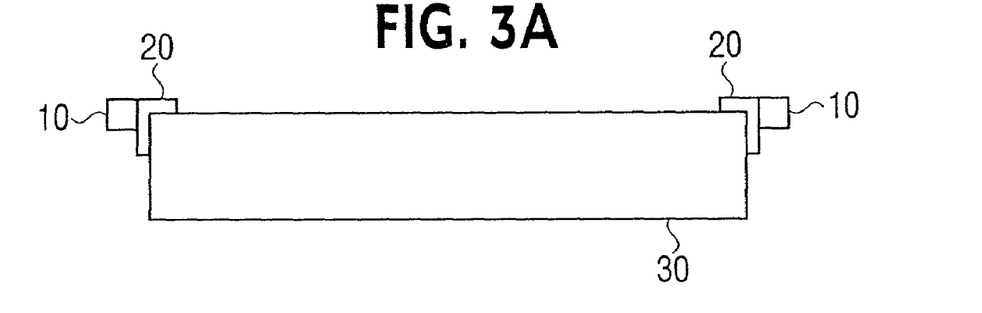
FIG. 3A is a side view of a slot holder used in an example embodiment of the present invention.

FIG. 3A is a side view of a slot holder used in an example embodiment of the present invention. The slot holder illustrated in FIG. 3A comprises a slot insertion member 30 that may hold slot 40 in its proper position. A grip member 10 is also provided so that a person may insert the slot holder containing slots 40 into the holes contained in the printed circuit board. In addition, a grip attachment member 20 is provided and serves at least two functions. First, the function of the grip attachment member 20 is to provide an attachment point for the grip member 10 to the slot insertion member 30. Further, the grip attachment member 20 may serve to limit the depth that the slot insertion member 30 may be placed into the slot 40.

Figure 3B:
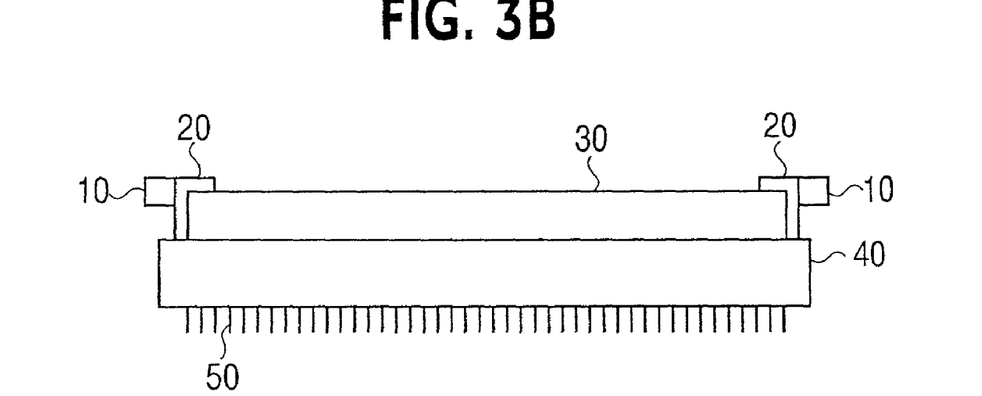
FIG. 3B is a side view a slot holder with a slot attached used in an example embodiment of the present invention.

FIG. 3B is a side view of a slot holder with a slot 40 attached used in an example embodiment of the present invention. As indicated in FIG. 3B slot 40 would abut against grip attachment member 20. However, as previously discussed and as would be appreciated by one of ordinary skill the art, alternative mechanisms for limiting the depths at which insertion member 30 is placed into card slot 45 are possible. Once slot insertion member 30 is placed into card slot 45 of slot 40, a person may insert pins 50 into a printed circuit board by holding grip members 10 and aligning pins 50 with the holes in the printed circuit board and pressing downwards.

Figure 4A:
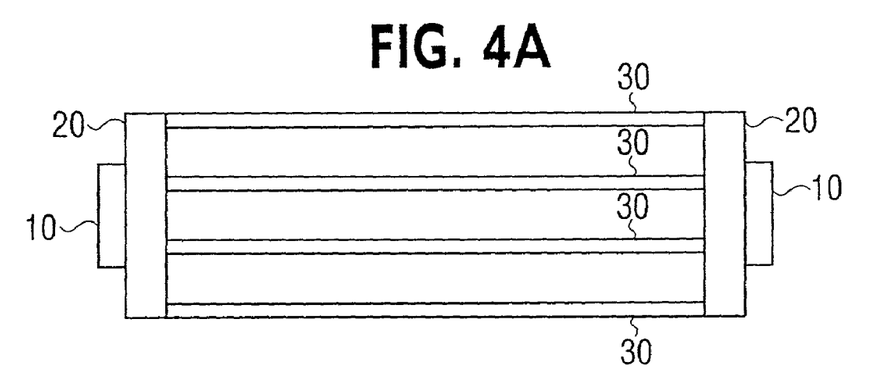
FIG. 4A is a top view of a slot holder used in an example embodiment of the present invention.
Figure 4B:
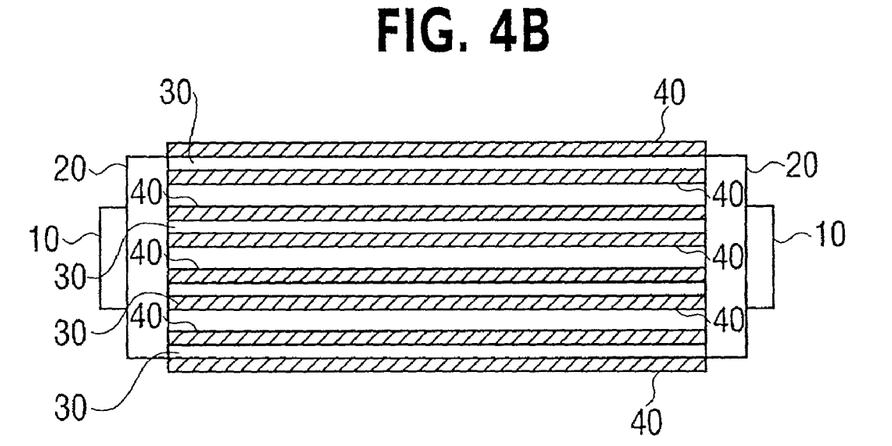
FIG. 4B is a top view a slot holder with a slot attached used in an example embodiment of the present invention.

FIG. 4A is a top view of the slot holder used in an example embodiment of the present invention. As shown in FIG. 4A, a plurality of slot insertion members 30 are all connected to two grip attachment members 20 which in turn are connected to two grip members 10. Therefore, any number of slot insertion members 30 may be attached to the grip attachment members 20 and thereby hold an equal number of slots 40. As indicated in FIGS. 4A and 4B, four slots 40 may be held by four slot insertion members 30 and an operator may place all four slots 40 into a printed circuit board simultaneously using the slot holder shown in FIGs 4A and 4B. However, the structure illustrated in FIGS. 4A and 4B are provided as examples and any number of slot insertion members 30 may be attached to grip attachment members 20 and thereby support an equal number of slots 40.

Figure 5A:
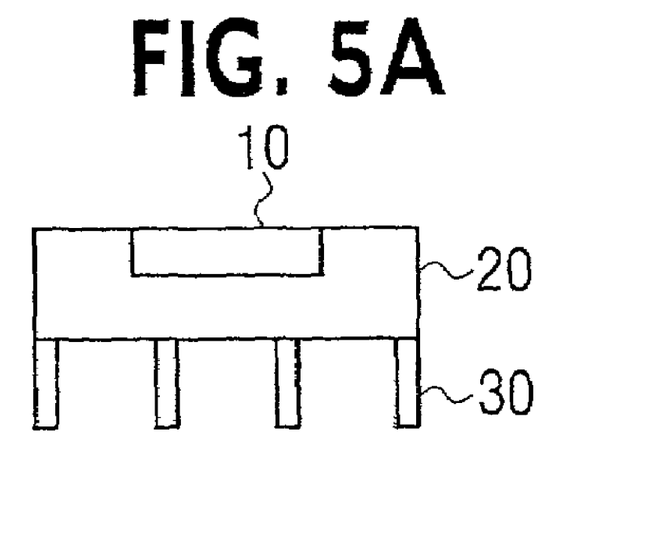
FIG. 5A is a front/rear view of a slot holder used in an example embodiment of the present invention.
Figure 5B:
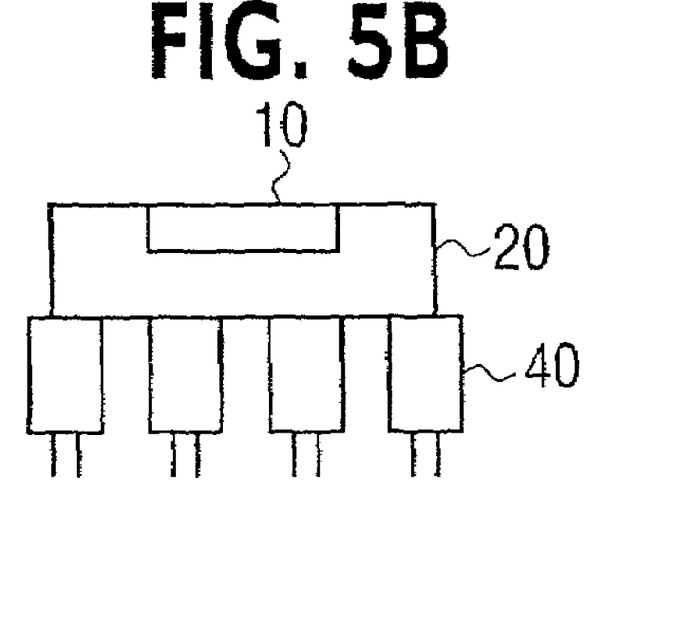
FIG. 5B is a front/rear view a slot holder with slots attached used in an example embodiment of the present invention.

FIGS. 5A and 5B are a front/rear view of the slot holder used in an example embodiment of the present invention as illustrated and discussed in FIGS. 3A through 4B. As with the previous figures, FIG. 5B illustrates an embodiment of FIG. 5A with slots 40 covering the slot insertion members 30. Otherwise, all other figure elements remain the same as previously discussed and will not be discussed further here.

Figure 6:
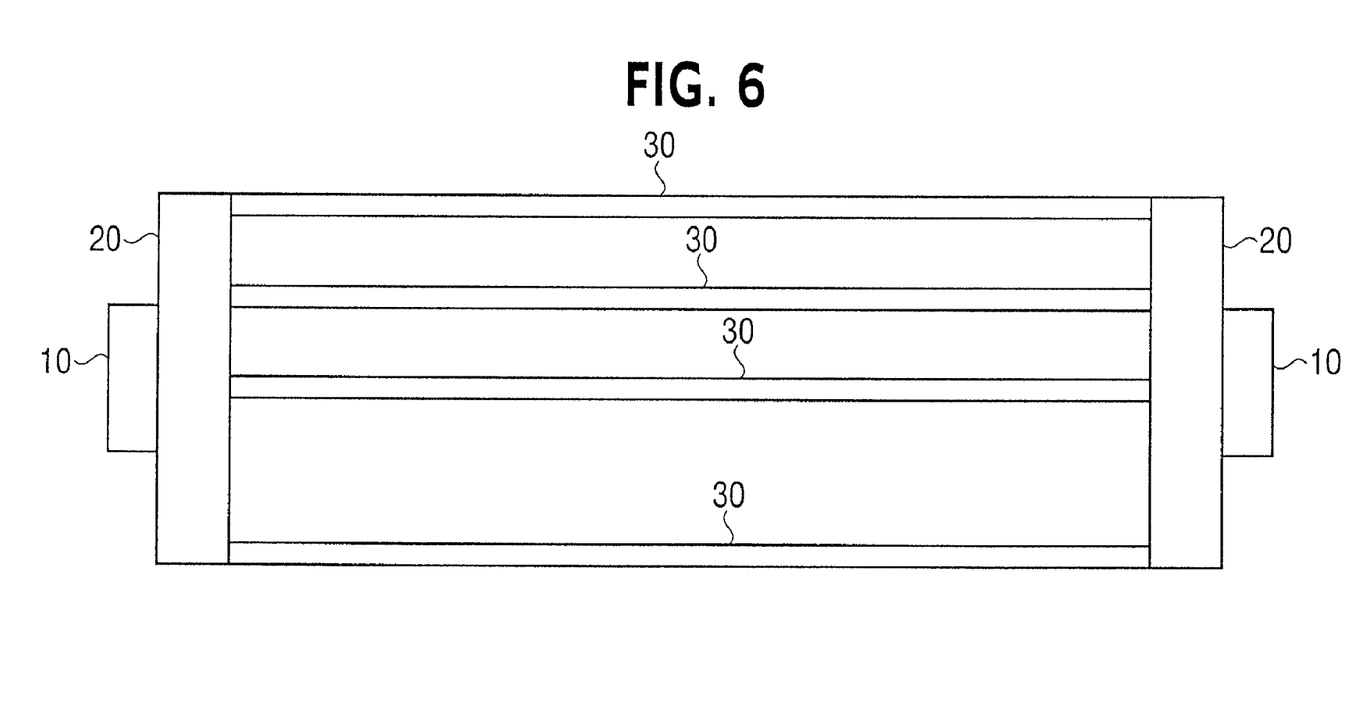
FIG. 6 is a top view of a slot holder used in an alternate example embodiment of the present invention.

FIG. 6 is a top view of a slot holder used in an alternate example embodiment of the present invention. FIG. 6 differs from FIG. 4A in that one slot insertion member 30 is missing. As would be appreciated by one of ordinary skill in the art the positioning and number of slot insertion members 30 depends on the configuration of the printed circuit board or baseboard 5. Therefore, any number of slot insertion members 30 may be contained in a slot holder and the spacing between slot insertion members 30 may vary. Further, the slot insertion members 30 may not be parallel to one another, as shown in FIG. 6, but may be placed at various angles to other slot insertion members 30 and relative to grip attachment member 20.

Figure 7:
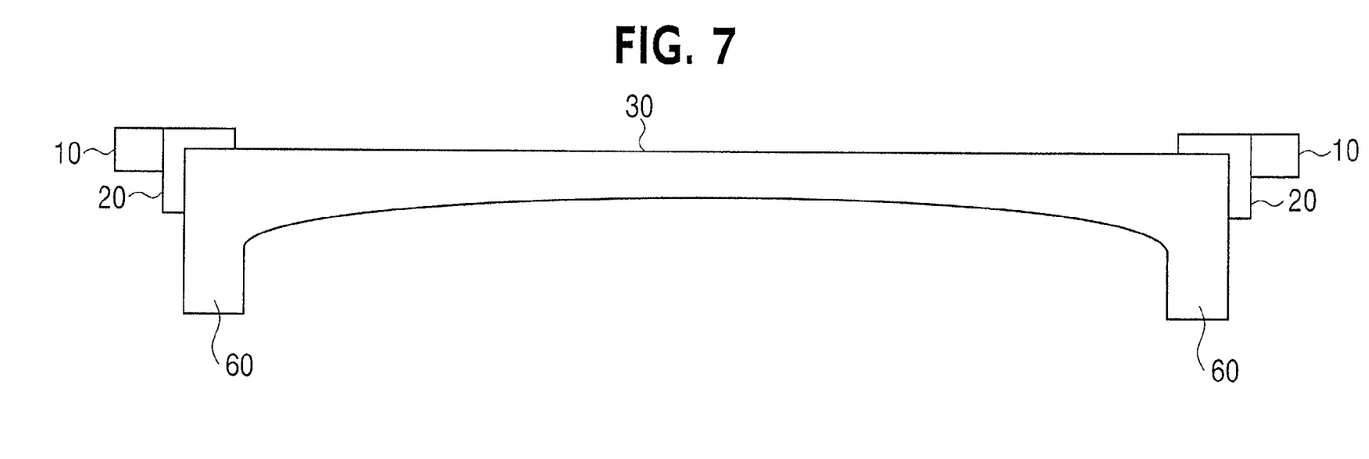
FIG. 7 is a side view of a slot holder used in an alternate example embodiment of the present invention.

FIG. 7 is a side view of a slot holder used in an alternate example embodiment of the present invention. The slot holder shown in FIG. 7 is similar to that shown in FIG. 3A with the exception that slot insertion member 30 has insertion points 60 at opposite ends of slot insertion member 30. The insertion points 60 serve to hold slot 40 in place only at the ends of card slot 45 of slot 40. In this manner the slot holder may be more easily removed once slots 40 have been placed on the baseboard 5 or the printed circuit board. Further, due to the concave shape of the indentation in the slot insertion member 30 between the insertion points 60, more pressure is applied to the ends of slots 40 than the middle.

Figure 8:
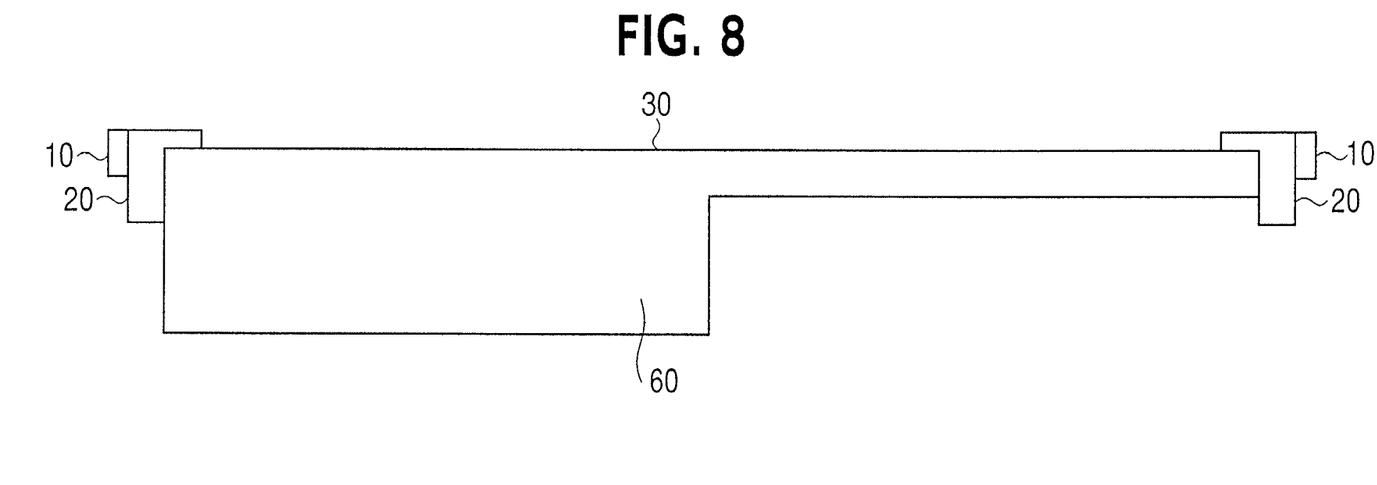
FIG. 8 is a side view of a slot holder used in an alternate example embodiment of the present invention.

FIG. 8 is a side view of a slot holder used in an alternate example embodiment of the present invention. The slot holder shown in FIG. 8 is similar to that shown in FIG. 3A with the exception that slot insertion member 30 has an insertion point 60 only at one end of slot insertion member 30. Having an insertion point 60 at one and as shown in FIG. 8 could server at least two different purposes. First, the slot holder, as shown in FIGS. 4A through 6, may be used to hold card slots 45 of different lengths. Therefore, the same slot holder may be used to insert both long and short slots 45 that may often be the case in a baseboard 5. Second, the insertion point 60 may serve to hold slot 40 in place only at one end of card slot 45 of slot 40. In this manner the slot holder may be more easily removed once card slots 40 have been placed on the baseboard 5 or the printed circuit board. Further, due to the insertion points 60 being at one end of slot insertion member 30, more pressure is applied to that one end of slots 40 than the other. This may be beneficial if only a portion of the printed circuit board has holes that are exposed to the action of the wave solder machine.

Figure 9:
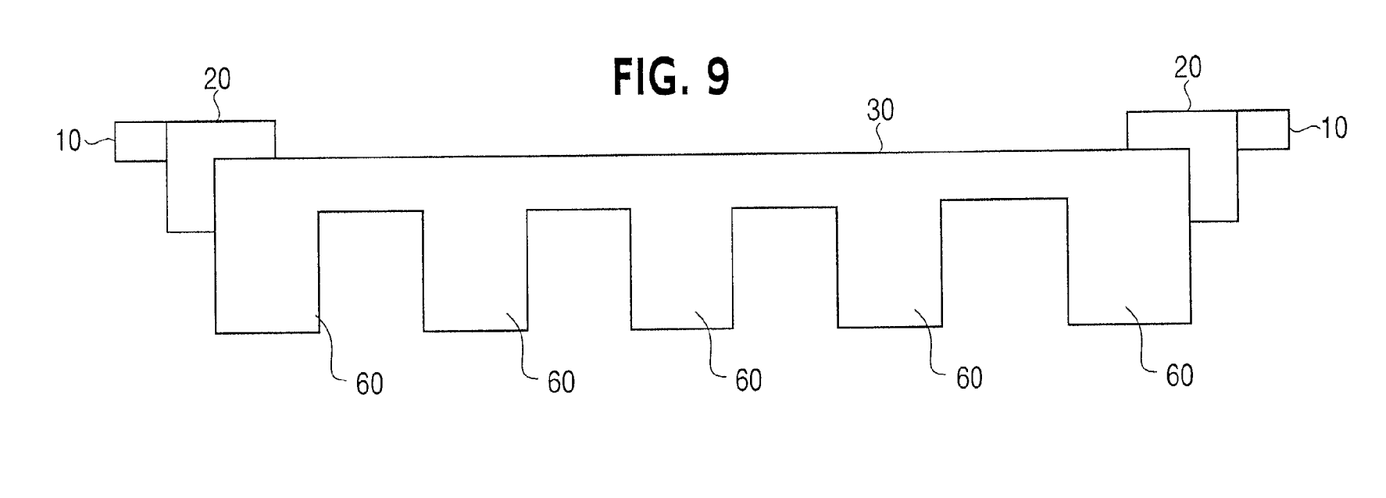
FIG. 9 is a side view of a slot holder used in an alternate example embodiment of the present invention.

FIG. 9 is a side view of a slot holder used in an alternate example embodiment of the present invention. The slot holder shown in FIG. 8 is similar to that shown in FIG. 3A with the exception that slot insertion member 30 has a number of insertion points 60 along the entire length of the slot insertion member 30. The insertion point 60 serves to hold slot 40 in place throughout the entire card slot 45 of slot 40. In this manner the slot holder may be more easily removed once slots 40 have been placed on the baseboard 5 or the printed circuit board as compared to the example embodiment shown in FIG. 3A. Further, due to the insertion points 60 being placed along the entire length of slot insertion member 30, pressure is equally applied to the slot 40.

Figure 10:
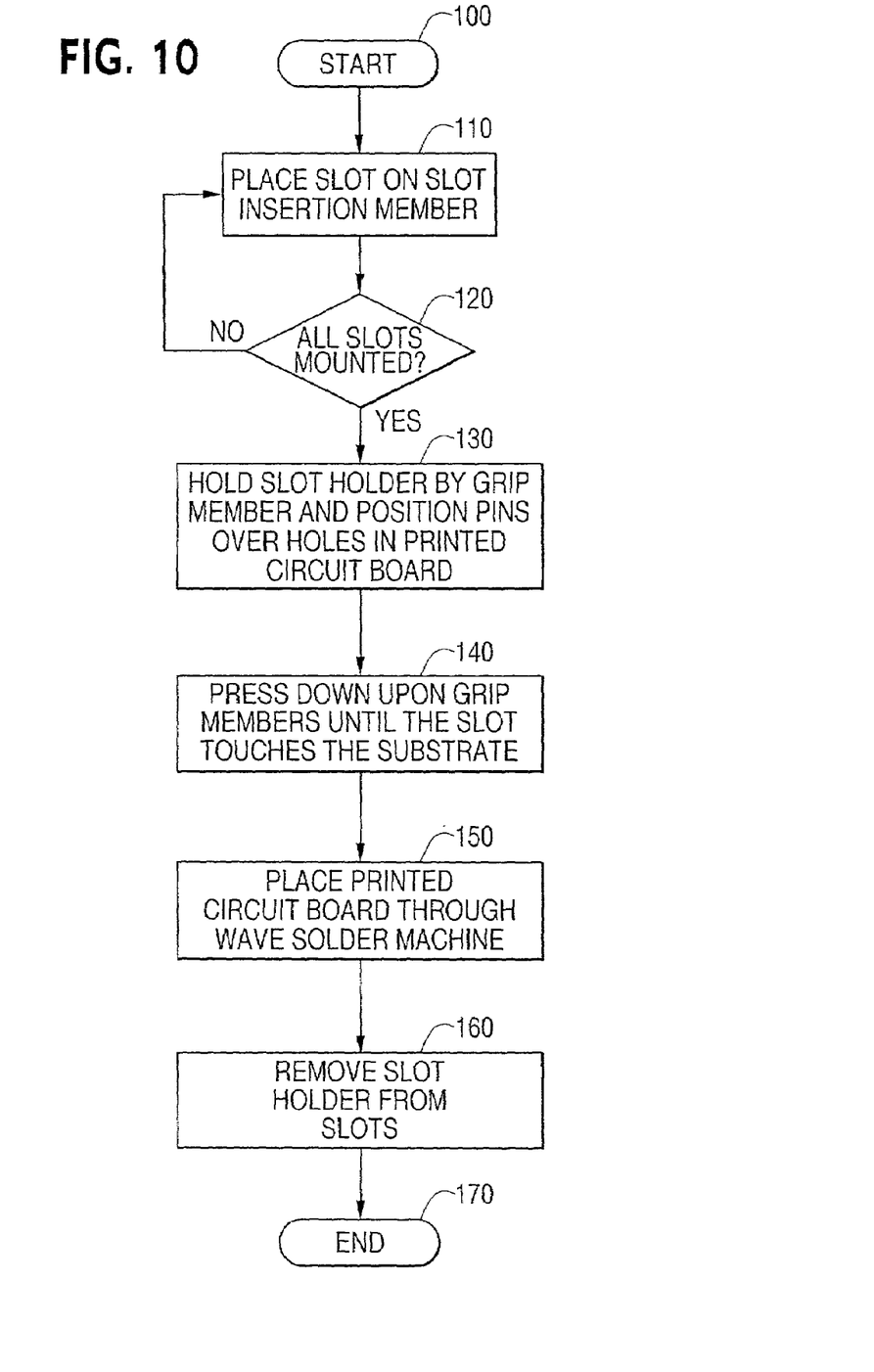
FIG. 10 is a flowchart illustrating the process employed in mounting a number of slots into a printed circuit board.

FIG. 10 is a flowchart illustrating the process employed in mounting a number of slots 40 into a printed circuit board. The process begins in operation 100 and immediately proceeds to operation 110. In operation 110, a slot 40 is placed on a slot insertion member 30. Thereafter, in operation 120 it is determined slots 40 have been mounted onto a slot insertion member 30. If all slots 40 have not been placed on a slot insertion member 30 then the process returns to operation 110. However, if all slots 40 have been placed on slot insertion members 30 then processing proceeds to operation 130. In operation 130 the slot holder is held by the group member 10 and positioned so that pins 50 align with the holes in the printed circuit board 5. Thereafter, in operation 140, pressure is applied to the grip members 10 until the slots 40 come into contact with the substrate of the printed circuit board. In operation 150, the printed circuit board is placed into a wave solder machine in which the pins 50 are soldered into position on the printed circuit board. Thereafter, in operation 160 the slot holder is removed from the slots and the process terminates in operation 170.

The benefit resulting from the present invention is that a simple, reliable, device and method is provided that will simplify and make more efficient the process of installing slots into printed circuit boards by enabling the simultaneous installation of several slots. Further, this device and method reduces the possibility of tilting occurring for a given slot caused either by manual displacement or the action of a wave solder machine by applying pressure simultaneously across several slots.

While we have shown and described only a few examples herein, it is understood that numerous changes and modifications as known to those skilled in the art could be made to the example embodiment of the present invention. Therefore, we do not wish to be limited to the details shown and described herein, but intend to cover all such changes and modifications as are encompassed by the scope of the appended claims.

We claim:

1. Apparatus, comprising:
   a plurality of slot insertion members to hold a plurality of card edge slots having a plurality of pins extending from each of the plurality of card edge slots in alignment for insertion of the plurality of pins into a plurality of holes of a printed circuit board;
   at least one grip attachment member connected to the plurality of slot insertion members to rigidly hold the plurality of slot insertion members in a fixed position; and
   at least one grip member connected to the at least one grip attachment member to enable the holding and positioning of the slot holder.

2. The apparatus recited in claim 1, wherein the plurality of slot insertion members are inserted into a card slot having a plurality of electrical contact points contained in the card edge slot connected to the plurality of pins.

3. The apparatus recited in claim 1, wherein the at least one grip attachment member comprises at least two grip attachment members attached to opposite ends of each of the plurality of slot insertion members.

4. The apparatus recited in claim 3, wherein the at least one grip member comprises at least two grip members with each grip member of the at least two grip members attached to each of the at least two grip attachment members.

5. The apparatus recited in claim 4, wherein the at least two grip members are grasped to align the plurality of pins with the plurality of holes and are used to press the pins into the holes without bending any of the plurality of pins or tilting any of the plurality of card edge slots relative to the printed circuit board.

6. The apparatus recited in claim 5, wherein each slot insertion member of the plurality slot insertion members holds each card edge slot in position while the printed circuit board is passed over a wave solder machine to solder the plurality of pins to the printed circuit board.

7. The apparatus recited in claim 6, wherein each slot insertion member of the plurality slot insertion members further comprises at least one insertion point inserted into a card slot having a plurality of electrical contact points contained in the card edge slot connected to the plurality of pins, wherein said at least one insertion point is the only portion of each slot insertion member that extends into the card slot.

8. The apparatus recited in claim 7, wherein said at least one insertion point comprises at least two insertion points located at an opposite end of each of the plurality of grip insertion members.

9. The apparatus recited in claim 7, wherein said at least one insertion point comprises at a plurality of insertion points located distributed along each of the plurality of grip insertion members.

10. The apparatus recited in claim 2, wherein said at least one grip attachment member limits the depth each slot insertion may be placed into the card slot.

11. Apparatus, comprising:
    a plurality of slot insertion members to hold a plurality of card edge slots having a plurality of pins extending from each of the plurality of card edge slots in alignment for insertion of the plurality of pins into a plurality of holes of a printed circuit board, wherein the plurality of slot insertion members are inserted into a card slot having a plurality of electrical contact points contained in the card edge slot connected to the plurality of pins;
    at least two grip attachment members connected to the plurality of slot insertion members to rigidly hold the plurality of slot insertion members in a fixed position; and
    at least two grip members connected to each grip attachment member to enable the holding and positioning of the slot holder.

12. The apparatus recited in claim 11, wherein the at least two grip members are grasped to align the plurality of pins with the plurality of holes and are used to press the pins into the holes without bending any of the plurality of pins or tilting any of the plurality of card edge slots relative to the printed circuit board.

13. The apparatus recited in claim 12, wherein each slot insertion member of the plurality slot insertion members holds each card edge slot in position while the printed circuit board is passed over a wave solder machine to solder the plurality of pins to the printed circuit board.

14. The apparatus recited in claim 13, wherein each slot insertion member of the plurality slot insertion members further comprises at least one insertion point inserted into a card slot having a plurality of electrical contact points contained in the card edge slot connected to the plurality of pins, wherein said at least one insertion point is the only portion of each slot insertion member that extends into the card slot.

* * * * *